United States Patent
Hong et al.

[11] Patent Number: 5,889,308
[45] Date of Patent: Mar. 30, 1999

[54] SEMICONDUCTOR DEVICE HAVING AN ELECTROSTATIC DISCHARGING PROTECTION CIRCUIT USING A NON-OHMIC MATERIAL

[75] Inventors: Ki Won Hong; Nam Ho Kim; Dae Hyung Cho, all of Kyoungki-Do, Rep. of Korea

[73] Assignee: Hyundai Electronics Industries Co., Ltd., Rep. of Korea

[21] Appl. No.: 907,854

[22] Filed: Aug. 8, 1997

[30] Foreign Application Priority Data

Aug. 9, 1996 [KR] Rep. of Korea ............... 1996 33247
Jan. 10, 1997 [KR] Rep. of Korea ............... 1997 499

[51] Int. Cl.$^6$ .................................................. H07L 23/62
[52] U.S. Cl. ........................... 257/355; 257/43; 257/528; 257/666; 257/207; 257/211
[58] Field of Search ................. 257/43, 173, 355–363, 257/528, 646, 776, 788, 207, 211

[56] References Cited

U.S. PATENT DOCUMENTS

| | | |
|---|---|---|
| 3,745,505 | 7/1973 | Turnbill et al. ............... 257/723 |
| 3,906,425 | 9/1975 | Tachibana et al. ............... 257/43 |
| 4,506,285 | 3/1985 | Einzinger ............... 257/665 |
| 4,559,579 | 12/1985 | Val ............... 257/355 |
| 5,089,929 | 2/1992 | Hilland ............... 257/355 |
| 5,143,651 | 9/1992 | Caffin ............... 252/518 |
| 5,686,697 | 11/1997 | Miller et al. ............... 174/52.2 |
| 5,773,876 | 6/1998 | Mekdhanasarn et al. ............... 257/671 |
| 5,796,570 | 8/1998 | Mekdhanasarn et al. ............... 361/126 |

*Primary Examiner*—David B. Hardy
*Attorney, Agent, or Firm*—Blakely Sokoloff Taylor & Zafman

[57] ABSTRACT

Disclosed is a semiconductor device capable of protecting an internal circuit from an ESD impact, damage and a mistaken working caused by an electrostatic discharge, a surge pulse and a noise, and more particularly to a semiconductor device capable of protecting an internal circuit from an external abnormal input without a protection circuit. The semiconductor device includes a varistor coupled to a conductor for discharging an abnormal input signal input to a ground voltage level. The varistor acts as a conductor when an input signal is an abnormal input signal and acts as an insulator when the input signal is a normal input signal. The use of the varistor may provide an improved ESD protection circuit and then promote the reliability of the semiconductor device.

13 Claims, 7 Drawing Sheets

SEMICONDUCTOR DEVICE HAVING AN ELECTROSTATIC DISCHARGING PROTECTION CIRCUIT USING A NON-OHMIC MATERIAL

BACKGROUND OF THE INVENTION

1. Field of the Invention

The present invention relates to a semiconductor device capable of protecting an internal circuit from an ESD impact, damage and a mistaken working caused by an electrostatic discharge, a surge pulse and a noise, and more particularly to a semiconductor device capable of protecting an internal circuit from an external abnormal input without a protection circuit.

2. Description of Related Art

Shown in FIG. 1 is a conventional electrostatic discharge protection circuit (hereinafter, referred to as an ESD protection circuit). Referring to FIG. 1, an external signal input through an input pad 10 is input into an internal circuit 40 through a pre-buffer 30 after passing through the ESD protection circuit 20. The internal circuit 40 are provided with power from a power supply Vdd, and provided with a second power from a ground voltage level GND.

The ESD protection circuit 20 includes a PMOS transistor 21 and an NMOS transistor 22, each of which acts as a diode. The gate and drain of the PMOS transistor 21 and a well where it is formed are coupled to the power supply Vdd, and also the source thereof is coupled to a node N1 in a conduction line 70 which is couple to the input pad 10 and the power supply Vdd. This PMOS transistor 21 acts as a diode between node N1 and the power supply Vdd. The gate and drain of the NMOS transistor 22 and a well where it is formed are coupled to a ground voltage level GND, and also the source thereof is coupled to a node N1. Accordingly, the NMOS transistor 22 acts as a diode between node N1 and the ground voltage level GND.

In other words, the ESD protection circuit 20 inputs an input signal only between −0.7 V and 5.7 V (in case of operation voltage of 5 V) to the pre-buffer 30 and protects the internal circuit 40 by discharging other voltage levels to the power supply Vdd and the ground voltage level GND.

As a result, since the conventional ESD protection circuit uses transistors for discharging the ESD impact in a chip, the occupying area of the ESD protection circuit considerably increases as comparing that of the internal circuit with the development of the integrated circuit. In addition, the protection of the internal circuit is limited in the difficulties in processing steps to improve the electrical characteristics of the ESD protection circuit.

Further, to solve signal noise generated when the semiconductor chip is mounted on the PCB, the conventional ESD protection circuit has additionally used a zener diode and a diode array filter relay circuit. However, this method requires the high cost of production and there is still a problem in that the semiconductor chip leads an error into its operation.

SUMMARY OF THE INVENTION

An object of the present invention is to provide a semiconductor device improving integration, reliability, stability and cost-cut, by implementing the protection of its internal circuit from an ESD impact through the package of the chip.

Another object of the present invention is to provide a semiconductor device capable of overcoming many difficulties in the processing steps used for improving the characteristics of an ESD protection circuit.

In accordance with an aspect to the present invention, there is provided a semiconductor device including an internal circuit supplied with an input signal from an external circuit, said semiconductor device comprising a means for transferring said input signal from said external circuit to said internal circuit, said means including: a plurality of conduction lines for electrically coupling said internal circuit to said external circuit; and a discharging member coupled to said conduction line for discharging an abnormal input signal to a first power supply, wherein said discharging member acts as a conductor when said input signal is said abnormal input signal and acts as an insulator when said input signal is a normal input signal.

In accordance with another aspect to the present invention, there is provided a semiconductor device including an external circuit supplied with an input signal from an external circuit, said semiconductor device comprising: a means for transferring said input signal from said external circuit to said internal circuit, said means including: a plurality of conduction lines for electrically coupling said internal circuit to said external circuit; a discharging member coupled to said conduction line for discharging an abnormal input signal to a first power supply, wherein said discharging member acts as a conductor when said input signal is said abnormal input signal and acts as an insulator when said input signal is a normal input signal; and a metal line horizontally disposed within said discharging member and is vertically spaced apart from said conduction line ohmic metal line.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Hereinafter, an embodiment of the present invention will be in detail described referring to accompanying drawings.

Typically, a non-ohmic material device, such as a SiC and ZnO varistors, has a nonlinear characteristic of I–V (current-voltage) curve and acts as a diode. The non-ohmic material acts as an insulator below the specific voltage (in case of varistor, a tunnelling voltage) by passing through only fine current. On the other hand, the non-ohmic material device acts as an excellent conductor in voltage more than the specific voltage.

The present invention has various advantages in that the ESD protection and the removal of noise are implemented, by interconnecting a plurality of pins coupled to the non-ohmic material device, such as SiC and ZnO varistors.

Figure 2A:
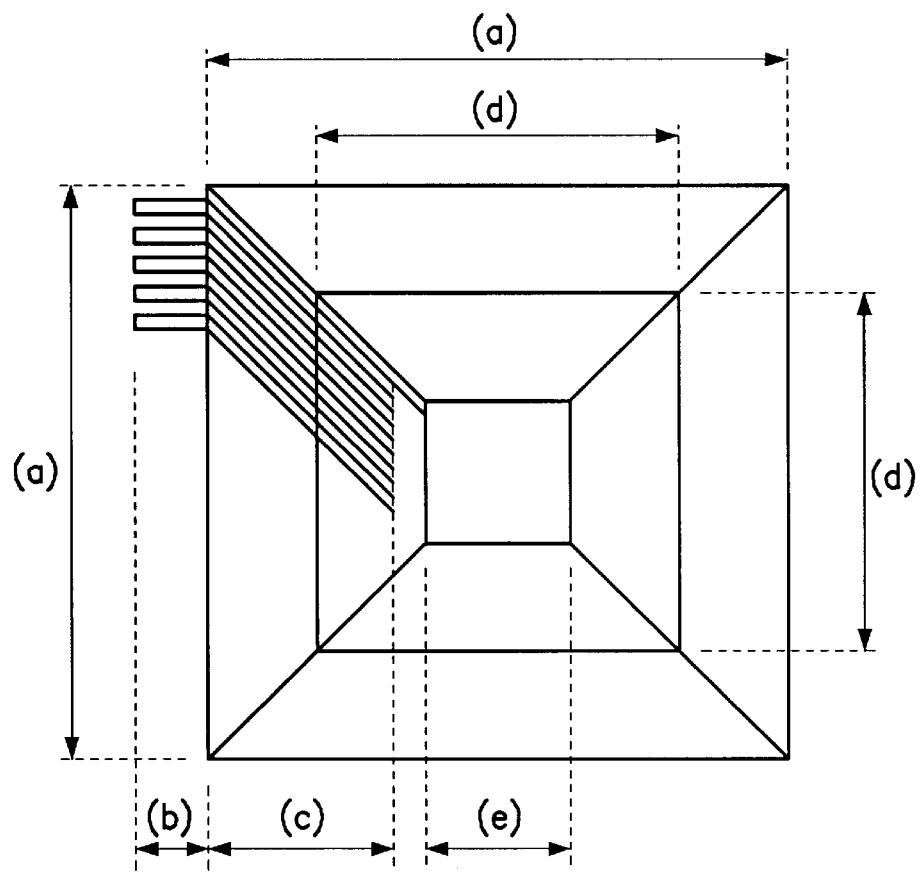
FIG. 2A is a top plane view illustrating pins of a lead frame in the semiconductor device using a non-ohmic material in a package of a semiconductor chip according to an embodiment of the present invention.
Figure 2B:
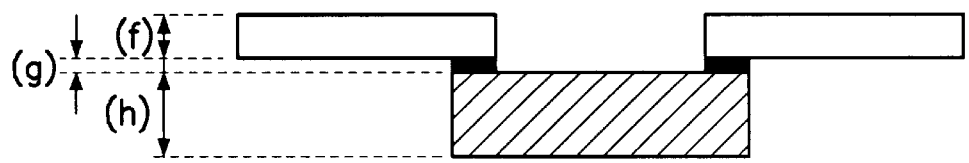
FIG. 2B is a cross-sectional view of FIG. 2A.
Figure 3:
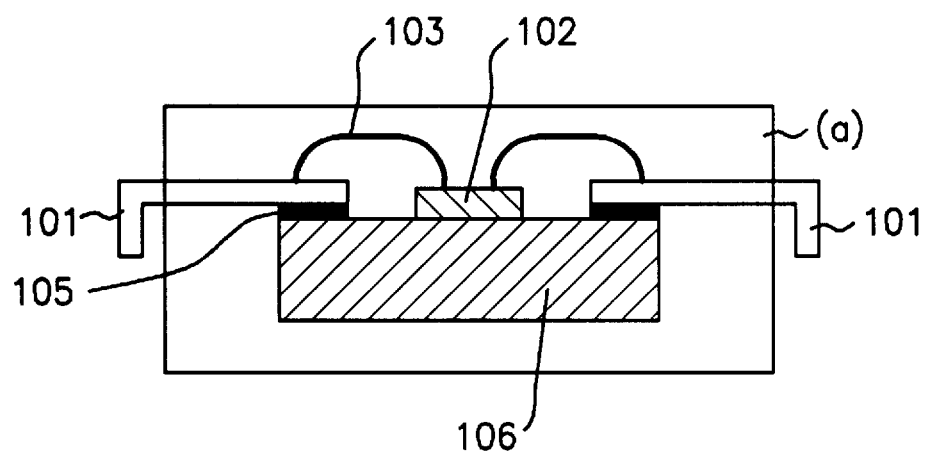
FIG. 3 is a cross-sectional view illustrating pins of a package of semiconductor chip according to an embodiment of the present invention.

Shown in FIG. 2A is the pins of a lead frame in the semiconductor device using the non-ohmic material in a package of a semiconductor chip according to an embodiment of the present invention. Also, FIG. 2B is a cross-sectional view of FIG. 2A, and FIG. 3 is a cross-sectional view illustrating pins of a package of semiconductor chip according to an embodiment of the present invention. In FIGS. 2A, 2B and 3, the reference numeral (a) denotes a molding compound area, (b) a first pin area exposed after the package process, (c) a second pin area molded by the molding compound after the package process, (d) and (h) a non-ohmic material are, (e) a chip-on-die (die pad) of the lead frame, (f) a cross-sectional view of the pins, (g) an electrode area adhering to the non-ohmic material, 101 pins (hereinafter, referred to as input/output (I/O) pins), 102 a semiconductor chip, 103 a bonding wire, 105 metal electrodes, and 106 a non-ohmic material.

As shown in FIG. 2A, 2B and 3, all the I/O pins 101 according to the present invention are connected to the non-ohmic material 106 and the metal electrodes 105, such as Pt, Au and Ag, are sandwiched between the I/O pins 101 and the non-ohmic material 106. In the present invention, the non-ohmic material 106 is formed in the form of a quadrangle panel, but it is possible to use any other forms, for example, core or round shape, which allow the I/O pins 101 to be electrically coupled to the metal electrodes 105. According to the present invention, the chip-on-die to bring contact into the pins of the lead frame with the varistor may be removed.

One of many methods for fabricating the above-mentioned pins will be described below.

The non-ohmic material, according to the preferred embodiment of the present invention, is characterized in that the tunneling voltage is the same 5 V as drives the semiconductor device, the maximum clamping voltage is 3000 V, and the response time is less than 1 ns. Further, total leakage current of the non-ohmic material is less than 1 $\mu$A. Considering the subsequent packaging processes, the size (see (d) are in FIG. 2A) of the layer of the non-ohmic material having the above characteristics is formed at a thickness of less than 1 mm so that one part of I/O pins 101 is covered with the non-ohmic material in the molding compound area (a). It would be appreciated that the characteristics of the non-ohmic material can be modified by adjusting its turn-on voltage.

After formation of the metal electrodes beneath the pins, the non-ohmic material adheres to the pins in the area (d) of FIG. 2A and the thermal treatment is applied to these elements at a temperature of approximately 200° C.

By proceeding to the conventional packaging processes after forming the above pins including the non-ohmic material coupled to the pins through the metal electrodes, the semiconductor chip, as shown in FIG. 3, is formed. Such a semiconductor chip, which uses the non-ohmic material, may be not in need of any ESD protecting circuit.

When the ESD impact much more than the operating voltage of the semiconductor device or the surge voltage is applied to the chip (internal circuit thereof) through the input pad and the bonding wire 103, the non-ohmic material 106 may act as a conductor. Therefore, before the stress pulse is applied to the chip through the bonding wire 103, the overcurrent is discharged to a ground voltage level through the non-ohmic material 106 which has a very low resistance in such an excessive current, thereby protecting the chip from the ESD impact, surge voltage or noise.

On the other hand, in case where the normal voltage between 0 V to 5 V is applied to the input pad, the non-ohmic material 106 may act as an insulator so that the input current is normally input into the chip through the bonding wire 103. In this operation, each pin, which is formed on the same surface of the non-ohmic material, functions as an electrode.

Figure 4:
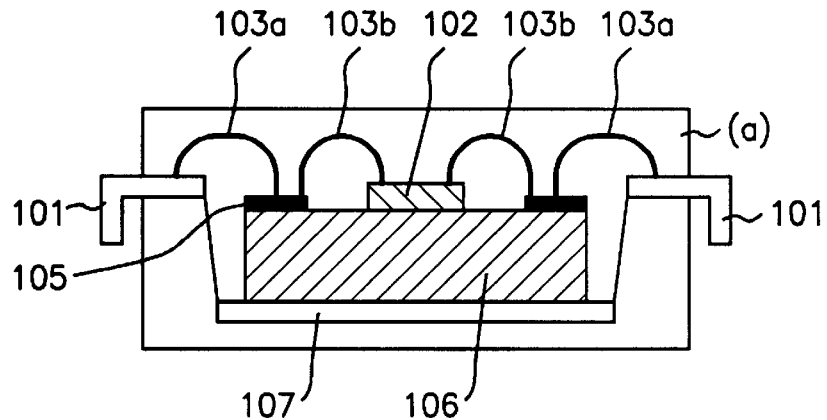
FIG. 4 is a cross-sectional view illustrating pins of a package of semiconductor chip according to another embodiment of the present invention.

FIG. 4 is a cross-sectional view illustrating another embodiment of the present invention. Referring now to FIG. 4, the pins are not directly connected to the non-ohmic material 106, but indirectly connected to the non-ohmic material 106 through a bonding wire 103a and the metal electrode 105. Also, the chip 102 is electrically connected to the metal electrode 105 through a bonding wire 103b, by using, so-called, double wire bonding method.

The non-ohmic material 106 is formed on the chip-on-die used for mounting the chip 102 on the semiconductor package module, the metal electrodes 105 are formed on a portion of the non-ohmic material 106 together with the chip 102, and the metal electrodes 105 are electrically coupled to the pin 101 and the chip 102 through the bonding wire 103a and 103b, respectively. This embodiment has another advantage in that it is not necessary to carry out the thermal treatment required in FIG. 3.

Figure 5A:
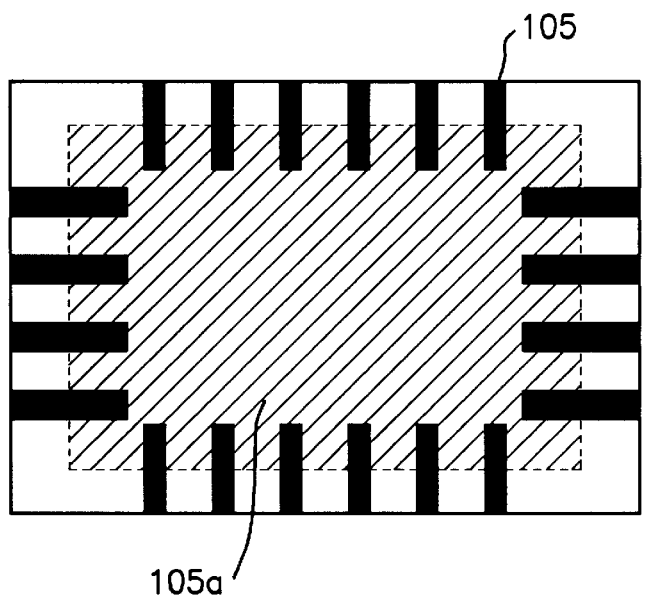
FIG. 5A a top plane view illustrating a structure of a varistors according to the present invention.
Figure 5B:
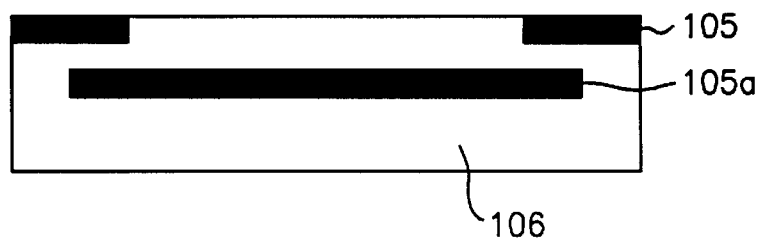
FIG. 5B a cross-sectional view illustrating a structure of varistors according to the present invention.

FIGS. 5A and 5B are top and cross-sectional views showing a detailed structure of varistors according to the present invention, respectively. As shown in FIGS. 5A and 5B, the metal electrodes 105 are spaced apart from one another and formed over the non-ohmic material 106 electrically coupled (or bonded) to the pins in the molding compound area (a). To form a discharging current path between the metal electrodes 105, an inner electrode 105a is horizontally formed in the non-ohmic material 106, being vertically spaced apart form the metal electrodes 105 which is formed on the surface of the non-ohmic material 106.

In the preferred embodiment of the present invention, it is necessary to include a separate inner electrode so as to keep the turn-on voltage constant in any direction. In other words, the turn-on voltage of the varistor according to the present invention is determined by the number of grain boundaries between the metal electrode and the inner electrode in a vertical direction (because the inner electrode is horizontally disposed within the varistor as shown in FIG. 5B) so that the signal (overcurrent) is applied to the metal electrode 105 coupled to the pin, transferred to the inner electrode 105a, and then discharged to another metal electrode 105 coupled to a ground voltage level. Therefore, although any I/O pin is selected as a signal line or a ground line, a constant turn-on voltage can be maintained, thereby providing an effective ESD protection. This inner electrode may be made in the various form of plate, overlaying the metal electrodes at its edge. This embodiment describes only one inner electrode, it would be appreciated that a plurality of inner electrodes could be used in a vertical direction and in a constant distance to improve the ESD protection.

Furthermore, in the present invention, instead of connection of the pins to varistors, it is possible to substitute the non-ohmic material for the molding compound, and also to fill the space between the pins with the non-ohmic material using the thin film technique.

In addition, the non-ohmic material may carry out the function of the low voltage varistor used for the ESD impact and surge voltage in various systems and an electrical module used therein.

These embodiments mentioned above are implemented in the package processing steps of the semiconductor device. Furthermore, the present invention can be implemented in a semiconductor manufacturing process steps using the non-ohmic material which will be described below.

Figure 1:
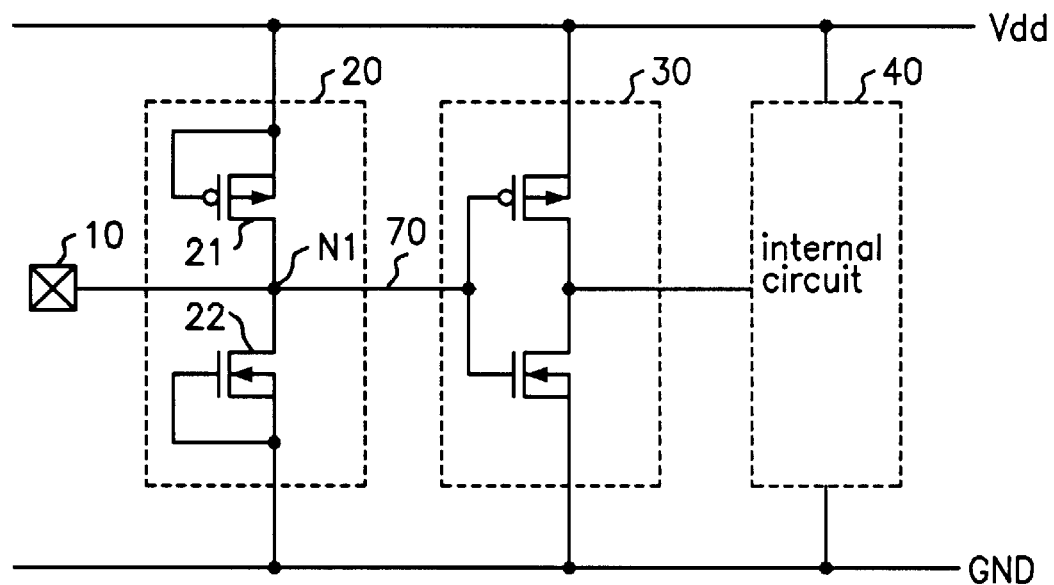
FIG. 1 is a schematic view illustrating the semiconductor device having a conventional ESD protection circuit.
Figure 6A:
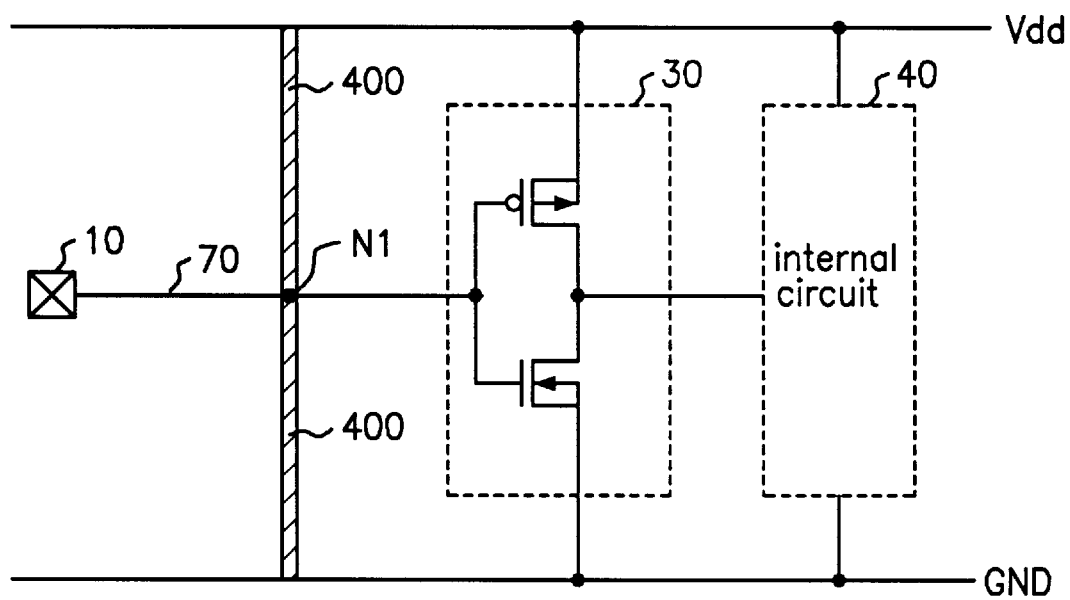
FIG. 6A is a block diagram illustrating an implement of an ESD protection circuit using a non-ohmic material according to the present invention.

FIG. 6A is a block diagram illustrating an implement of an ESD protection circuit using a non-ohmic material according to the present invention. In FIGS. 1 and 6A, the same reference numerals denote the same elements. Referring to FIG. 6A, the conduction line 70, which connects the input pad 10 to the pre-buffer 30, is coupled to the power supply Vdd and the ground voltage level GND through a non-ohmic material line 400. When an abnormal pulse is applied to the chip via the input pad 10, the non-ohmic material line 400, which acts as a conductor in such an abnormal pulse, discharges the abnormal pulse to the power supply Vdd and the ground voltage level GND. Consequently, the chip is protected from the ESD impact.

The non-ohmic material line 400 may be formed by the thin film process, such as the sputtering or CVD (Chemical Vapor Deposition) process, as well known to those having ordinary skill in the art to which the subject matter pertains.

Figure 6B:
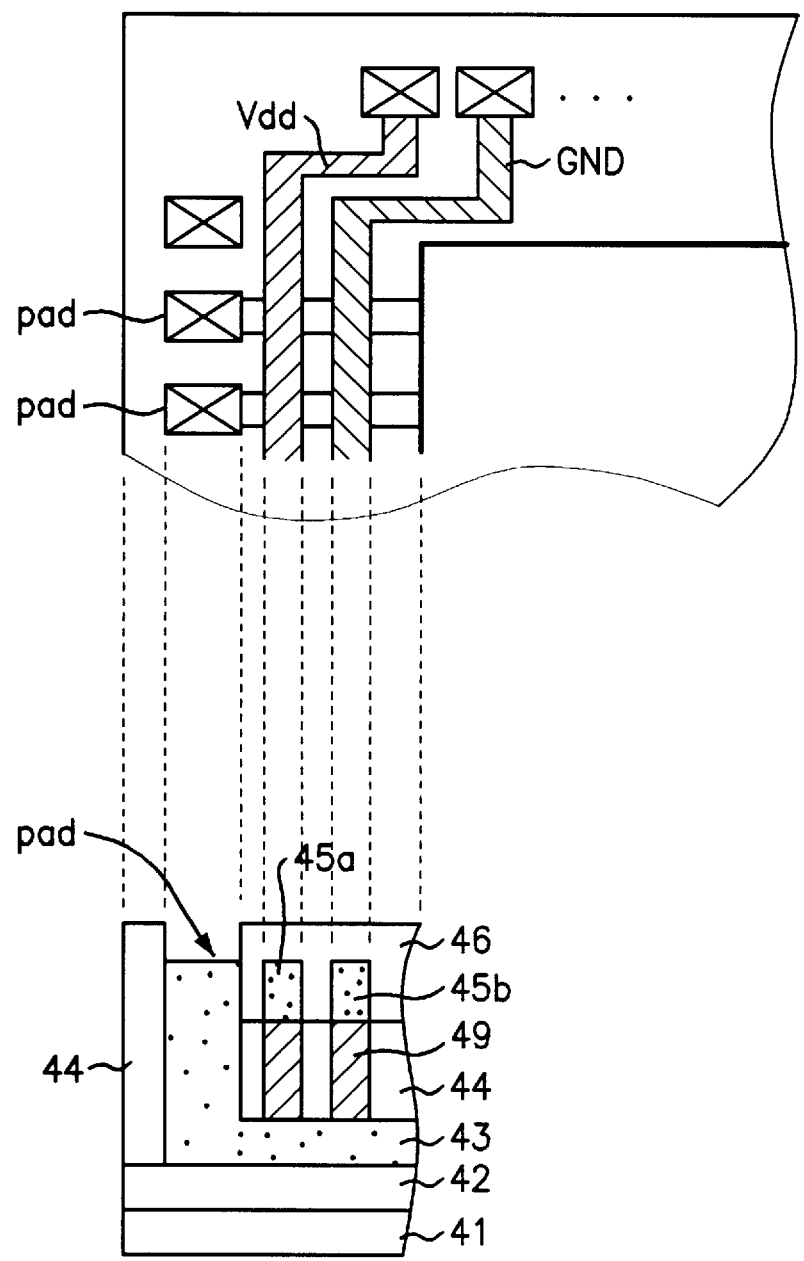
FIG. 6B is a top plane and cross-sectional view illustrating a structure of a semiconductor chip using the non-ohmic material used in FIG. 6A.

FIG. 6B is a top plane and cross-sectional view illustrating a structure of a semiconductor chip using the non-ohmic material used in FIG. 6A. In FIG. 6B, the conduction line is made of a first metal line and the power line is made of a second metal line. The upper portion of the FIG. 6B shows a top plane view of a portion of FIG. 6A and the lower portion of the FIG. 6B shows a cross-sectional view of a portion of FIG. 6A. Also, the reference numeral 41 denotes a semiconductor substrate, 42 and 44 insulating layers, 43 a first metal line, 45a a second metal line for power supply, 45b a ground voltage line, 46 a passivation layer, 49 a non-ohmic material layer.

As shown in FIG. 6B, if the non-ohmic material layer 49 is connected to the first metal line 43, the second metal line 45a and the ground voltage line 45b, the conduction line 70 in FIG. 6A, which connects the input pad 10 to the pre-buffer 30, may discharge the overcurent to the power supply Vdd and the ground voltage level GND through the non-ohmic material layer 49.

Figure 7A:
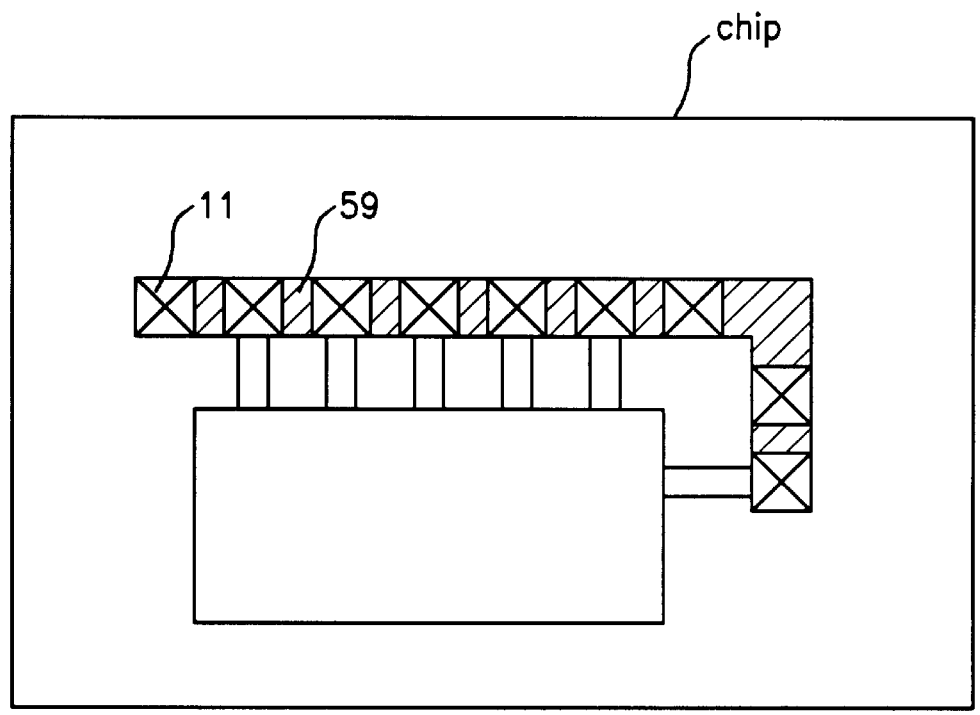
FIG. 7A a top plane view illustrating an implement of an ESD protection circuit according to further another embodiment of the present invention.
Figure 7B:
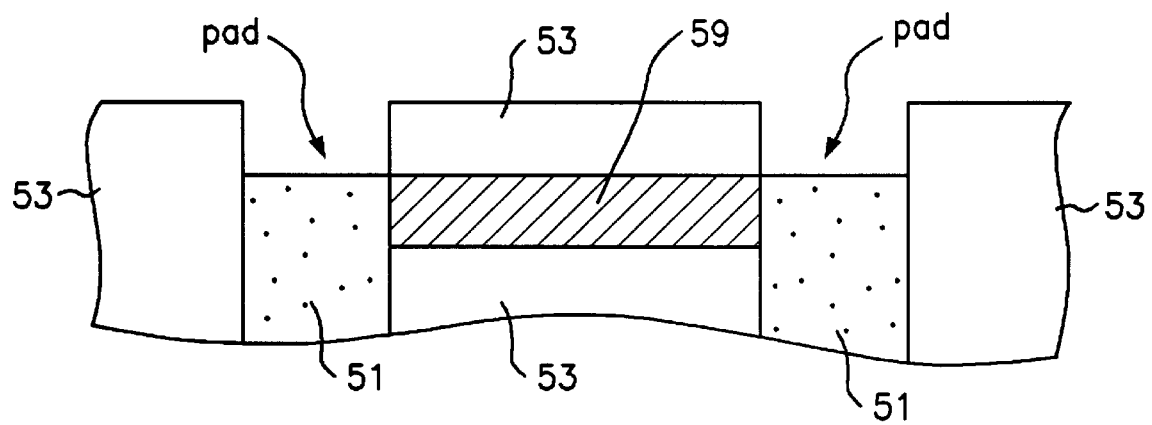
FIG. 7B is a cross-sectional view of FIG. 7A.

Referring to FIG. 7A, there is shown a top plane view illustrating an implement of an ESD protection circuit according to further another embodiment of the present invention. The non-ohmic material layer 59, which is connected to a ground voltage level for discharging the overcurrent input from an external circuit, connects all pads 11 formed in the semiconductor chip. FIG. 7B is a cross-sectional view of FIG. 7A. In FIG. 7B, the reference numeral 51 denotes a metal line and 53 a passivation layer. This connection shown in FIG. 7B is well known to those having ordinary skill in the art to which the subject matter pertains.

As apparent from the above description, the abnormal pulse is prevented from being input into the internal circuit, by using the non-ohmic material in the ESD protection circuit of the semiconductor chip or package thereof. The use of the non-ohmic material may provide an improved ESD protection circuit and then promote the reliability of the semiconductor device. Also, the use of the non-ohmic material has an effect on the removal of a specific noise by adjusting the tunneling voltage thereof. The present invention has another effect of reducing a period of time required to improve the characteristics of transistor and the integration. Further, the present invention allows the designer easily to design the semiconductor chip without the consideration of the complicate ESD protection circuit, for example, a zener diode, a diode array filter and a delay circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device including an internal circuit comprising:
    an input pin for inputting an input signal to the internal circuit;
    a power supply pin and a ground pin for providing a power supply voltage and a ground voltage to the internal circuit, respectively; and
    a discharging member commonly coupled to said input pin, said power supply pin and said ground pin, and in a form of a varistor under the internal circuit, so as to discharge an abnormal input signal selectively to the power supply pin or the ground pin.

2. A semiconductor device in accordance with claim 1, further comprising:
    a plurality of bonding wires each being coupled between one of said input pin, said power supply pin and said ground pin, and the internal circuit, respectively.

3. A semiconductor device in accordance with claim 1, wherein the varistor has a tunneling voltage corresponding to the potential supply voltage.

4. A semiconductor device in accordance with claim 1, further comprising a plurality of ohmic metal layers, each being formed between one of said input pin, said power supply pin and said ground pin, and said discharging member.

5. A semiconductor device in accordance with claim 4, wherein said ohmic metal layer is any one of Pt, Au and Ag layers.

6. A semiconductor device in accordance with claim 1, wherein said varistor has a thickness of approximately 1 mm.

7. A semiconductor device in accordance with claim 6, wherein said varistor is a SiC varistor.

8. A semiconductor device in accordance with claim 6, wherein said varistor is a ZnO varistor.

9. A semiconductor device including an internal circuit, comprising:
    a plurality of signal pins each for transferring to and from the internal circuit;
    at least one power supply pin and at least one ground pin for providing a power supply voltage and a ground voltage to the internal circuit, respectively; and
    a plurality of varistance material layers each formed between any two neighboring pins of said signal pins, said power supply pin and said ground pin, so as to discharge an abnormal signal provided to one of said signal pins selectively to the power supply pin or to the ground pin.

10. A semiconductor device, including an internal circuit, comprising:
    an input pin for inputting an input signal to the internal circuit;

a power supply pin and a ground pin for providing a power supply voltage and a ground voltage to the internal circuit, respectively;

a discharging member commonly coupled to said input pin, said power supply pin and said ground pin, and formed of a varistor under the internal circuit, so as to discharge an abnormal input signal selectively to the power supply pin or to the ground pin;

a plurality of ohmic metal layers each formed on said discharging member;

a plurality of first bonding wires, each electrically connecting one of said input pin, and said power supply pin and said ground pin to one of said ohmic metal layers, respectively, and a plurality of second bonding wire, each electrically connecting one of said ohmic metal layers to a corresponding portion of said internal circuit, respectively.

11. A semiconductor device in accordance with claim 10, wherein said discharging member is used as a molding compound.

12. A semiconductor device including an internal circuit, comprising:

a power supply pin and a ground pin for inputting a power supply voltage and a ground voltage, respectively;

a plurality of signal pins each for transferring signals to and from the internal circuit;

a plurality of first metal lines each coupled to a corresponding one of said signal pins, respectively, and extended in a first direction;

two varistance material lines each commonly connected to the first metal lines and formed over the first metal lines, extending in a second direction that is substantially orthogonal to the fist direction; and two second metal lines each coupled to the power supply pin and the ground pin, respectively, and formed over the two varistance material lines, extending in the second direction, whereby an abnormal signal of one of the signal pins are discharged selectively to the power supply pin or to the ground pin, through one of the first metal lines, one of the varistance material lines, and one of the second metal lines.

13. A semiconductor device in accordance with claim 12, wherein said varistance material lines are formed using a molding compound.

* * * * *

UNITED STATES PATENT AND TRADEMARK OFFICE
CERTIFICATE OF CORRECTION

PATENT NO. : 5,889,308
DATED : March 30, 1999
INVENTOR(S) : Hong et al.

It is certified that error appears in the above-identified patent and that said Letters Patent is hereby corrected as shown below:

In column 2, line 16, delete "an external circuit" and insert -- an internal circuit -- .

In column 3, line 24, delete "material are" and insert -- material area -- .

In column 3, line 51, delete "are in FIG. 2A" and insert -- area in FIG. 2A -- .

In column 6, line 16, delete "an internal circuit" and insert -- an internal circuit, -- .

Signed and Sealed this

Twenty-first Day of November, 2000

Attest:

Q. TODD DICKINSON

Attesting Officer     Director of Patents and Trademarks